(12) United States Patent
Gregerson

(10) Patent No.: US 9,633,877 B2
(45) Date of Patent: Apr. 25, 2017

(54) WAFER CONTAINER WITH DOOR MOUNTED SHIPPING CUSHIONS

(71) Applicant: ENTEGRIS, INC., Billerica, MA (US)

(72) Inventor: Barry Gregerson, Deephaven, MN (US)

(73) Assignee: Entegris, Inc., Billerica, MA (US)

( * ) Notice: Subject to any disclaimer, the term of this patent is extended or adjusted under 35 U.S.C. 154(b) by 121 days.

(21) Appl. No.: 14/398,959

(22) PCT Filed: May 6, 2013

(86) PCT No.: PCT/US2013/039769
§ 371 (c)(1),
(2) Date: Nov. 4, 2014

(87) PCT Pub. No.: WO2013/166515
PCT Pub. Date: Nov. 7, 2013

(65) Prior Publication Data
US 2015/0083639 A1    Mar. 26, 2015

Related U.S. Application Data

(60) Provisional application No. 61/643,158, filed on May 4, 2012.

(51) Int. Cl.
*H01L 21/673*   (2006.01)

(52) U.S. Cl.
CPC .. *H01L 21/67369* (2013.01); *H01L 21/67383* (2013.01)

(58) Field of Classification Search
CPC ................... H01L 21/67369; H01L 21/67383
(Continued)

(56) References Cited

U.S. PATENT DOCUMENTS

| 4,995,430 | A   | 2/1991 | Bonora et al. |
| 5,207,324 | A * | 5/1993 | Kos .................. H01L 21/67369 206/453 |

(Continued)

FOREIGN PATENT DOCUMENTS

| JP | 2012004380       | 1/2012 |
| KR | 10-2000-0026629 A | 5/2000 |

(Continued)

*Primary Examiner* — Steven A. Reynolds
(74) *Attorney, Agent, or Firm* — Entegris, Inc. Legal Dept.; Brian E. Szymanski; Catherine D. Gates

(57) ABSTRACT

A cushioned wafer container system having removable wafer cushions for transporting large-diameter wafers. The system includes a wafer container enclosure defining a front opening and including a rear wall, and a plurality of wafer supports defining a plurality of slots; a front door configured to attach to the wafer enclosure at the front opening and defining a front side and a rear side; a primary wafer cushion coupled to a rear side of the front door at a central portion of the front door, the primary wafer cushion defining a plurality of wafer grooves, each of the grooves of the primary wafer cushion aligned with a slot of the wafer supports; and a first removable wafer cushion attachable to the rear side of the front door adjacent the primary wafer cushion, the first removable wafer cushion defining a plurality of wafer-receiving grooves in alignment with the grooves and slots.

18 Claims, 10 Drawing Sheets

(58) Field of Classification Search
USPC .................. 206/711, 454, 710, 832, 833
See application file for complete search history.

(56) References Cited

U.S. PATENT DOCUMENTS

| | | | |
|---|---|---|---|
| 5,228,568 A | 7/1993 | Ogino et al. | |
| 5,273,159 A | 12/1993 | Gregerson | |
| 5,555,981 A * | 9/1996 | Gregerson | H01L 21/67369 206/454 |
| 6,082,540 A * | 7/2000 | Krampotich | H01L 21/67369 206/445 |
| 6,267,245 B1 * | 7/2001 | Bores | H01L 21/67369 206/454 |
| 6,273,261 B1 * | 8/2001 | Hosoi | H01L 21/67294 206/459.5 |
| 6,951,284 B2 * | 10/2005 | Cheesman | H01L 21/67369 206/454 |
| 7,168,587 B2 | 1/2007 | Eggum | |
| 7,182,203 B2 | 2/2007 | Burns et al. | |
| 7,316,315 B2 * | 1/2008 | Matsutori | H01L 21/67369 206/454 |
| 7,344,031 B2 * | 3/2008 | Hasegawa | H01L 21/67369 206/454 |
| 7,726,490 B2 * | 6/2010 | Matsutori | H01L 21/67369 206/454 |
| 7,823,730 B2 * | 11/2010 | Mimura | H01L 21/67369 206/454 |
| 8,118,169 B2 * | 2/2012 | Hosoi | H01L 21/67369 206/454 |
| 2003/0047476 A1 * | 3/2003 | Wu | H01L 21/67369 206/454 |
| 2003/0221985 A1 | 12/2003 | Yajima et al. | |
| 2006/0042998 A1 | 3/2006 | Haggard et al. | |
| 2007/0295638 A1 * | 12/2007 | Nakatogawa | H01L 21/67369 206/711 |
| 2009/0206001 A1 * | 8/2009 | Sasaki | H01L 21/67376 206/711 |
| 2010/0025287 A1 * | 2/2010 | Lin | H01L 21/67369 206/711 |
| 2010/0025288 A1 * | 2/2010 | Lin | H01L 21/67369 206/711 |
| 2010/0258475 A1 * | 10/2010 | Ogawa | H01L 21/67369 206/711 |
| 2010/0307957 A1 * | 12/2010 | Wiseman | H01L 21/67369 206/711 |
| 2013/0056388 A1 * | 3/2013 | Nagashima | H01L 21/67383 206/711 |

FOREIGN PATENT DOCUMENTS

| | | |
|---|---|---|
| KR | 10-2002-0025027 A | 4/2002 |
| KR | 10-2006-0050561 A | 5/2006 |
| WO | WO 97/13708 A1 | 4/1997 |

* cited by examiner

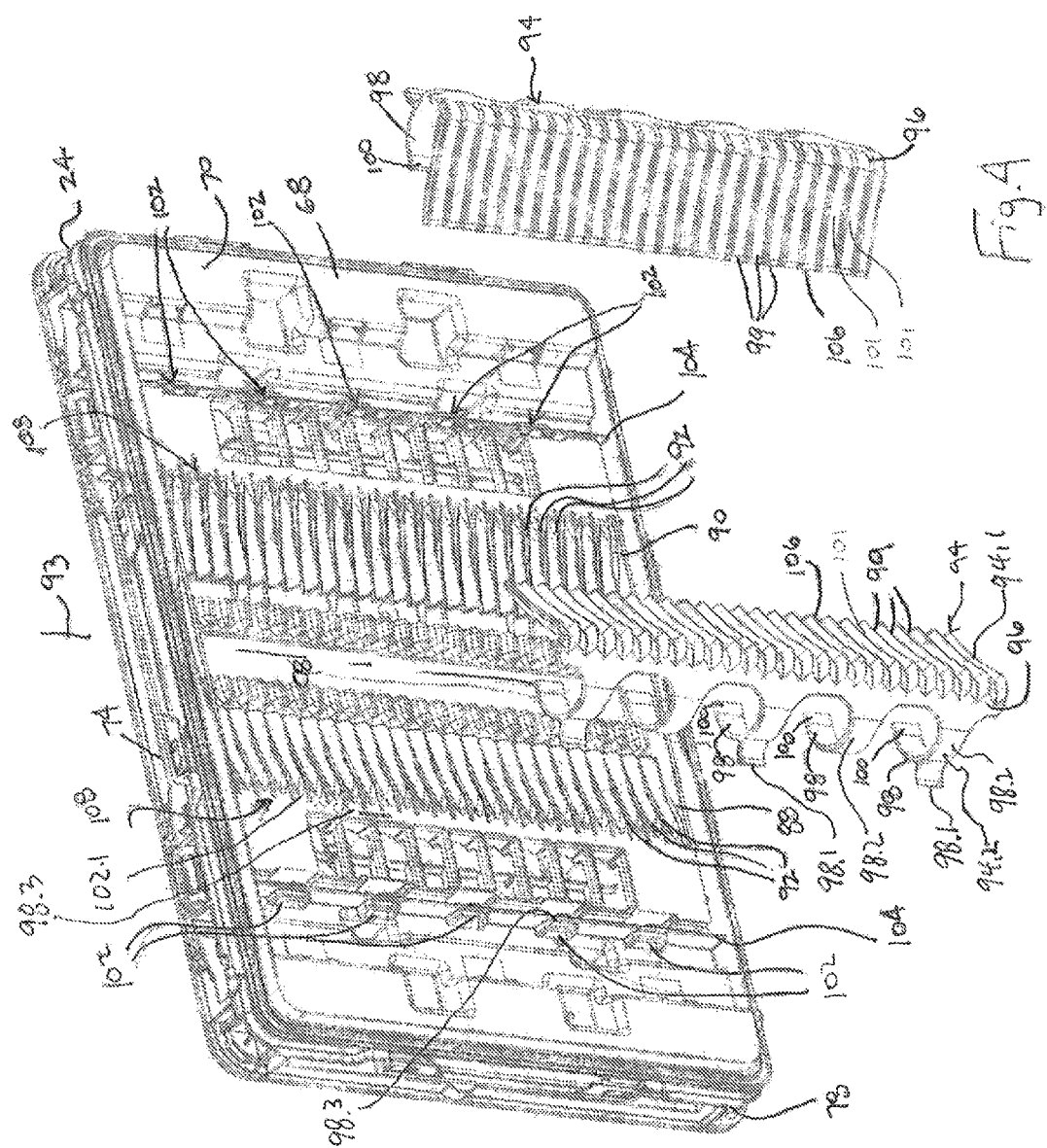

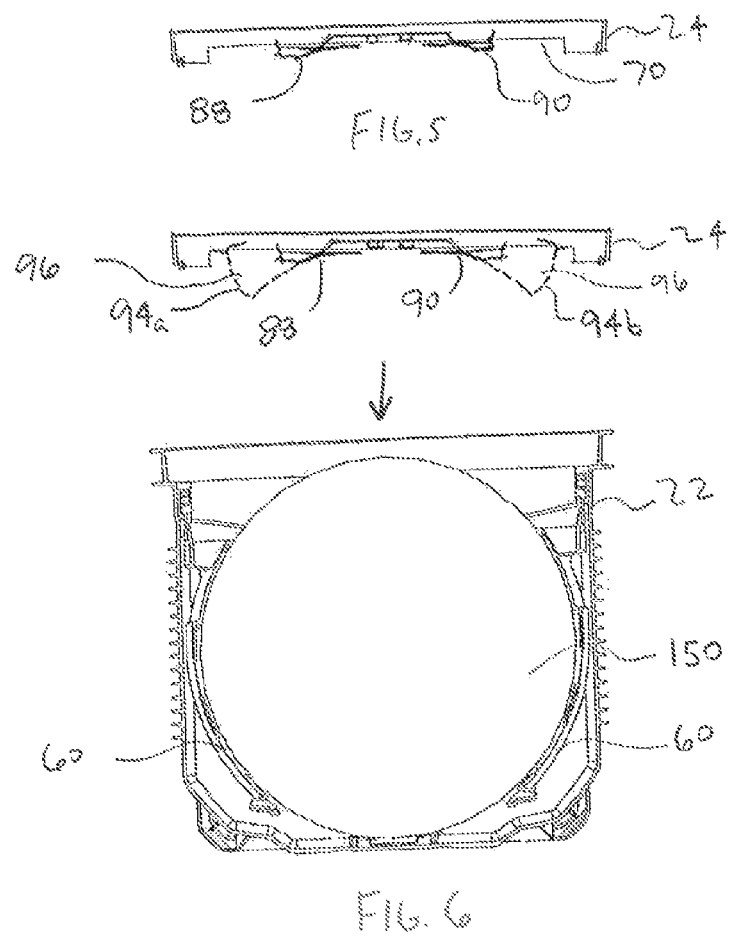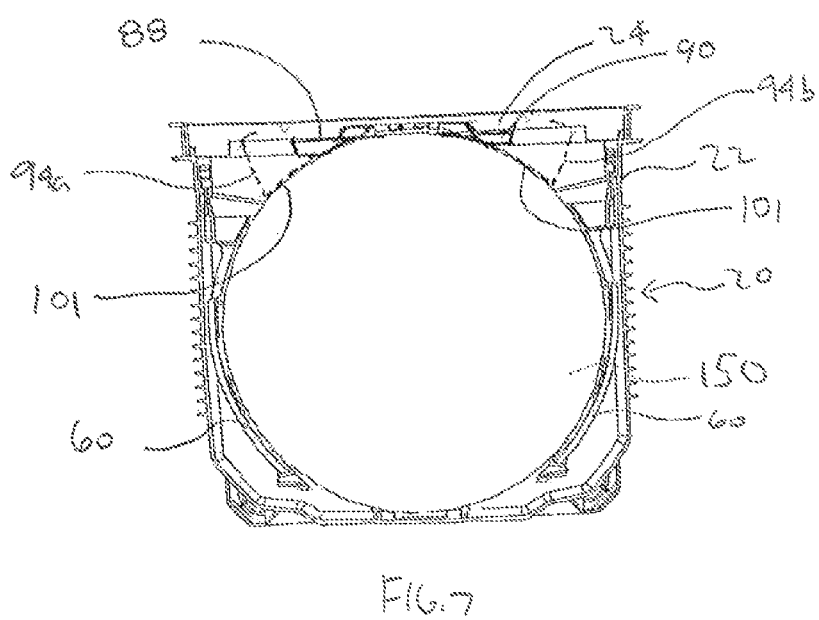

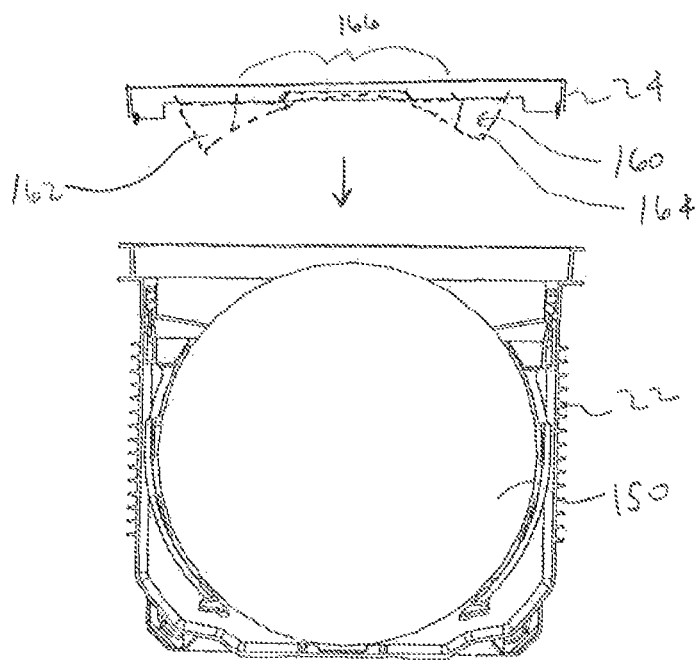
FIG. 8
FIG. 9
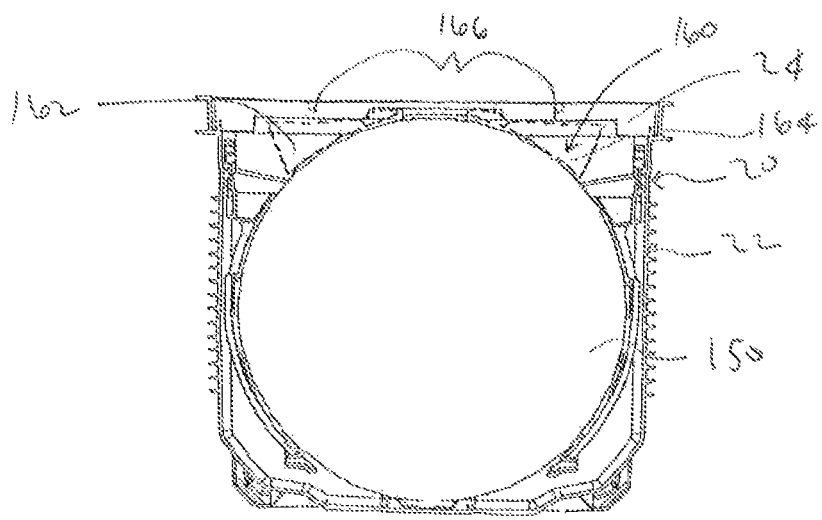
FIG. 10

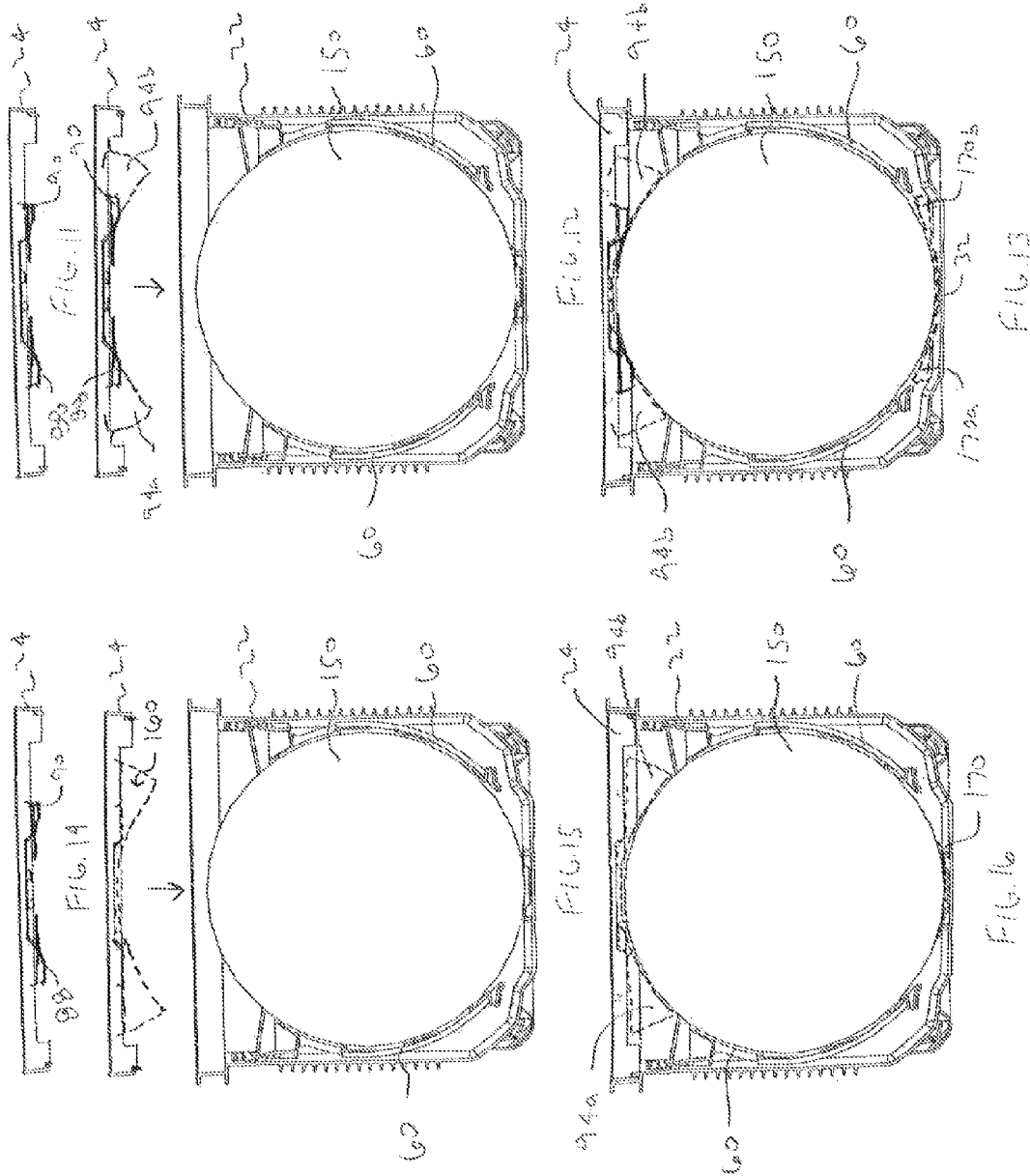

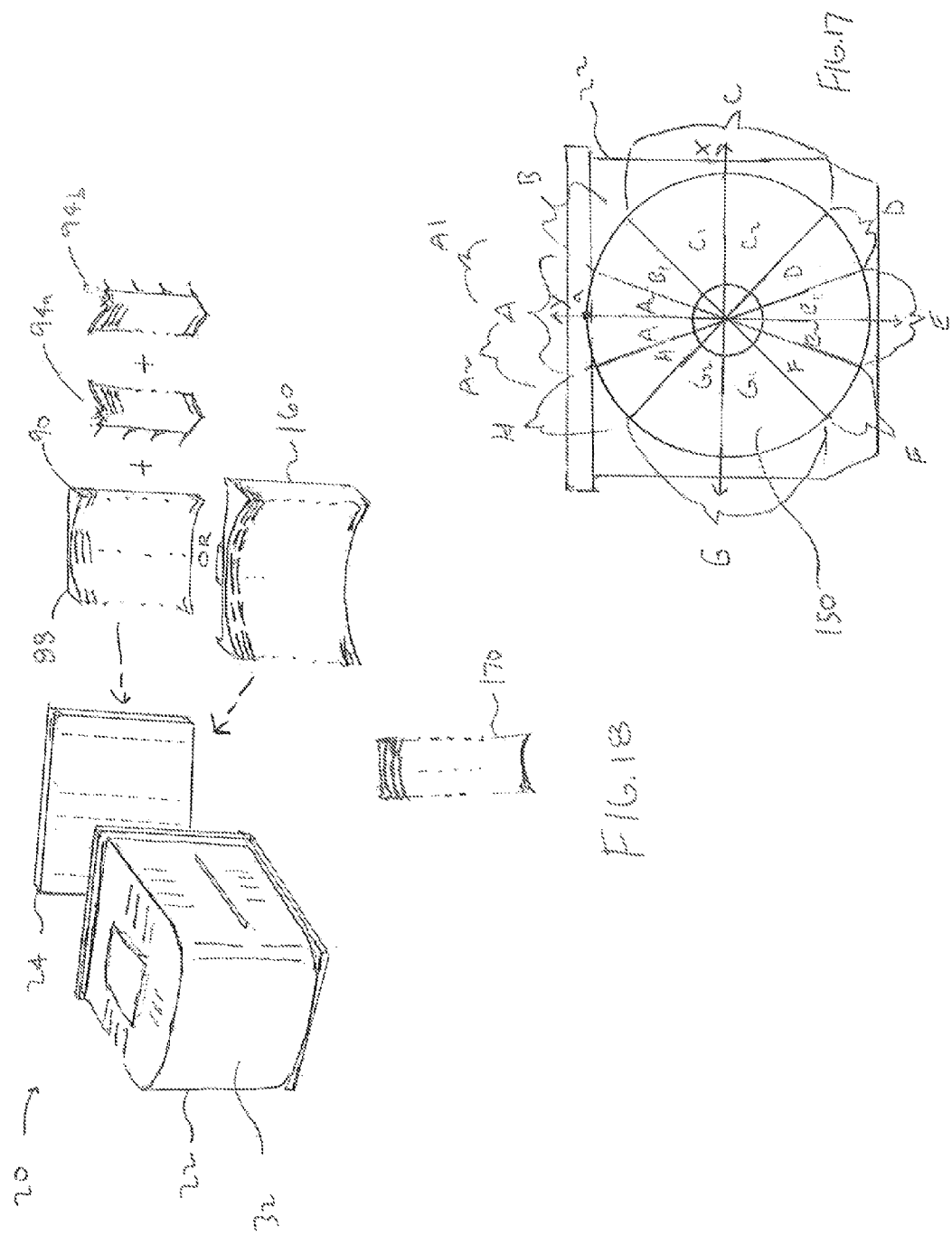

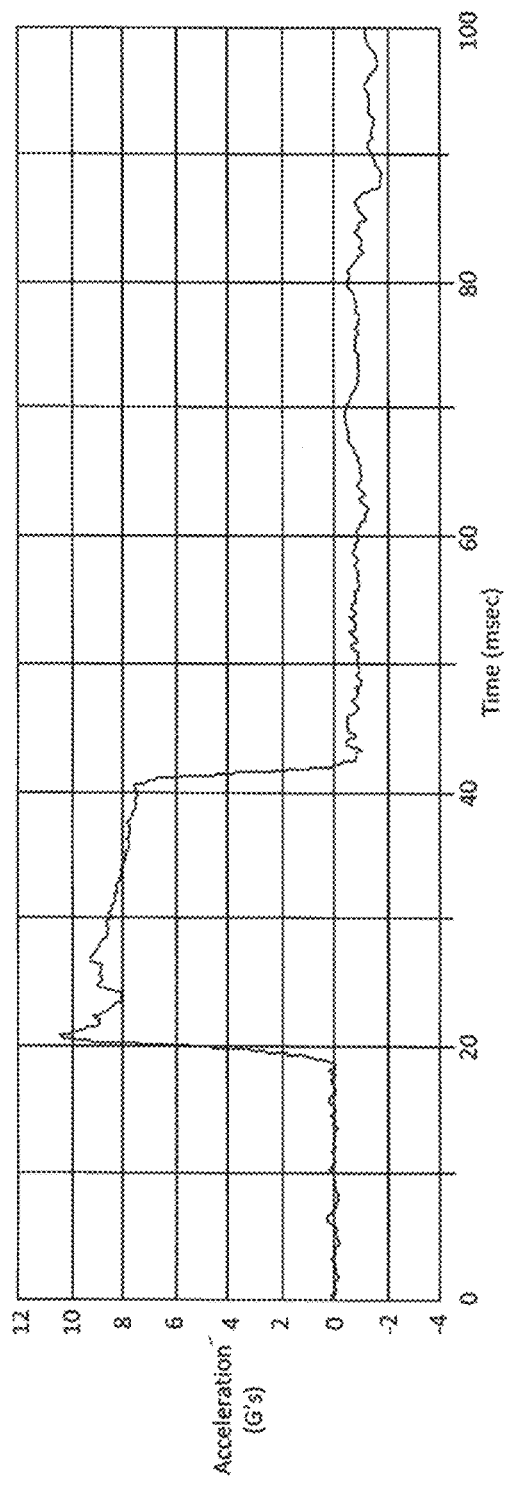
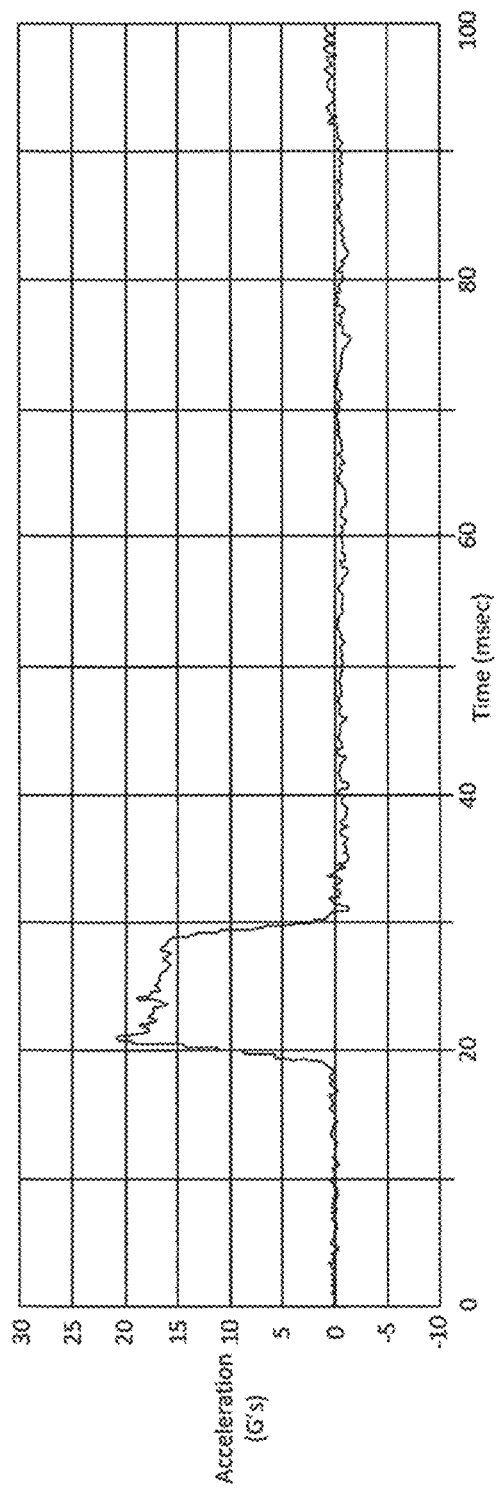

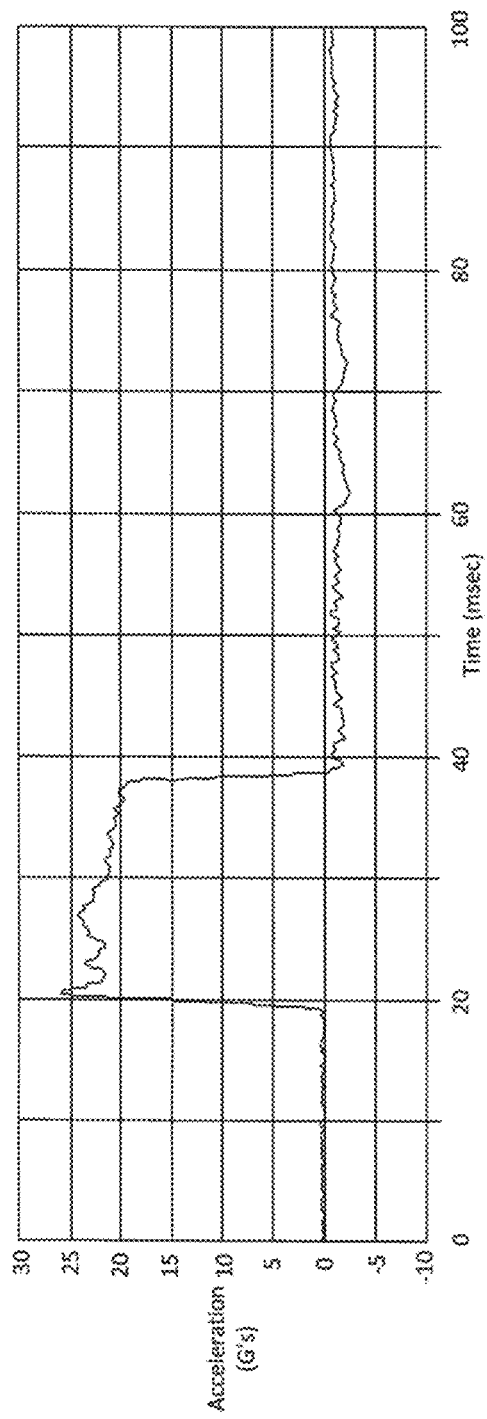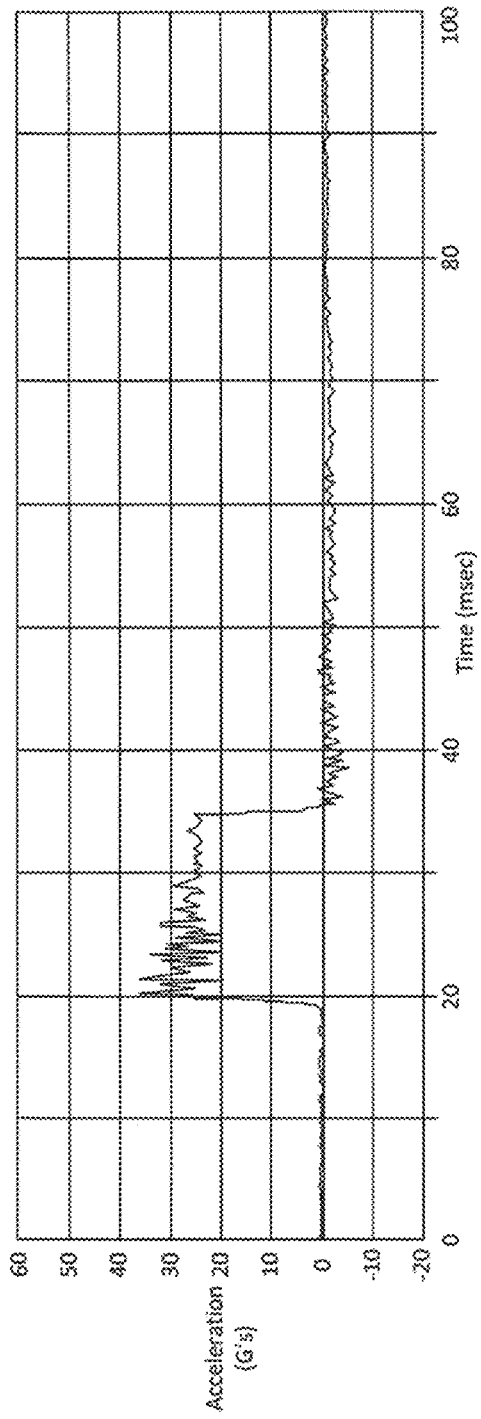

WAFER CONTAINER WITH DOOR MOUNTED SHIPPING CUSHIONS

RELATED APPLICATION

This present application is a National Phase entry of PCT Application No. PCT/US2013/039769, filed May 6, 2013, which claims priority to U.S. Provisional Application No. 61/643,158, filed May 4, 2012, the disclosures of which are incorporated by reference in their entirety.

FIELD OF THE INVENTION

This invention relates to containers for sensitive substrates such as semiconductor wafers and in particular to wafer cushions for such containers.

BACKGROUND OF THE INVENTION

Integrated circuits such as computer chips are manufactured from semiconductor wafers. These wafers are subjected to numerous steps during the process of making integrated circuits. This generally entails transporting a plurality of wafers from one place to another for processing. As part of the processing procedure, wafers may be temporarily stored or shipped in containers to other plants or to end users. Such intra-facility and extra-facility movements may generate or expose the wafers to potential wafer ruining contaminants and to physical shocks. In order to reduce the deleterious effect of such conditions on the wafers, specialized containers have been developed to minimize the generation of contaminants and to isolate wafers from physical shock.

Plastic containers have been used for decades for transporting and storing wafers in-between process steps. Such containers have highly controlled tolerances for interfacing with processing equipment as well as the equipment/robots that transport the containers. Moreover, it is desirable in such plastic containers to use components that are attachable and removable without using metallic fasteners such as screws, since metal fasteners can cause particle generation when inserted and removed.

Additional, required or desirable characteristics of containers to transport and/or store semiconductor wafers include light weight, rigidity, cleanliness, limited gaseous emissions, and cost effective manufacturability. The containers provide hermetic or close to hermetic isolation of wafers when the containers are closed. Simply stated, such containers need to keep the wafers clean, uncontaminated, and undamaged. Additionally, carriers need to maintain their capabilities under the rigors of robotic handling which includes lifting the carrier by the robotic flange positioned at the top of the container.

Front opening wafer containers have become the industry standard for transporting and storing large diameter 300 mm wafers. In such, containers the front door is latchable within a door frame of a container portion, and closes a front access opening through which the wafers are robotically inserted and removed. When the container is fully loaded with wafers the door is inserted into the door frame of the container portion and latched thereto. When seated, cushions on the door provide upward, downward, and inward constraint for the wafers.

The semiconductor industry is now moving toward using even larger, 450 mm diameter, wafers. The larger diameter wafers, although providing cost efficiencies, also provide increased fragility, greater weight, and present issues associated with handling and storing the larger wafers in containers made of plastic. Deflection and related problems associated with the expanses of plastic on the top, bottom, sides, front, and back are exacerbated, as are door sealing issues due to uneven seals and distortion of the door to door-frame interface due to the deflection of container surfaces.

A particular problem arises with physical shocks to which wafer containers may be subjected when shipped between facilities, especially when the containers are shipped individually. Wafer containers, especially those for larger size wafers such as 300 mm and 450 mm wafers, are typically designed such that the wafers are supported and cushioned on shelves with the plane of each wafer being generally horizontal. When shipped individually, however, a wafer container may be inverted or placed in a position where the wafers are not horizontal. In addition, the container may be subject to considerable shock loads when being handled. Such loads can exceed 8 G and may reach 20 G or more, which can fracture wafers that are not properly supported and restrained.

Previous attempts at addressing the problem of fractured wafers in transit of wafer containers have involved providing additional external cushioning members and packaging on the outside of sealed wafer containers. These prior attempts have met with limited success, and have not fully addressed the problem of wafer damage when containers are transported.

What is needed in the industry is a wafer container that provides greater physical shock resistance and better wafer support under typical shipping conditions.

SUMMARY OF THE INVENTION

Embodiments of the invention address the need of the industry for a wafer container that provides greater physical shock resistance and better wafer support under typical shipping conditions, particularly as those problems are experienced with containers for 450 mm diameter and larger wafers.

In an embodiment, removable shipping cushions are provided on either side of the typical primary wafer cushions on the inside surface of the front door of the wafer container. These shipping cushions provide additional, spaced-apart support for the front edges of the wafers in the containers. These shipping cushions improve the physical shock resistance performance of wafer containers including the disclosed removable shipping cushions up to double or more of that of prior art wafer containers. This allows for reduced cushioning requirements within the secondary packaging and full functionality with automation as defined in SEMI Standard E159.

In an embodiment, the claimed invention comprises a cushioned wafer container system having removable wafer cushions for transporting large-diameter wafers. The system comprises a wafer container enclosure configured to contain a plurality of semiconductor wafers, each wafer including a wafer periphery defining a first, second, third, and fourth quadrant, the wafer container defining a front opening and comprising a rear wall, and a plurality of wafer supports defining a plurality of slots for receiving edge portions of a plurality of wafers, the wafer supports supporting a first portion of a first quadrant periphery of the wafer and a first portion of a fourth quadrant periphery of the wafer; a front door configured to attach to the wafer enclosure at the front opening and defining a front side and a rear side, the rear side presenting itself to an interior of the wafer enclosure; a primary wafer cushion coupled to a rear side of the front door at a central portion of the front door, the primary wafer cushion defining a plurality of wafer grooves configured to receive and support a second portion of the first quadrant periphery of the wafer and a second portion of the fourth quadrant periphery of the wafer, each of the grooves of the primary wafer cushion aligned with a slot of the wafer supports; a first removable wafer cushion attachable to the rear side of the front door adjacent a first side of the primary wafer cushion, the first removable wafer cushion defining a plurality of wafer-receiving grooves in alignment with the grooves of the primary wafer cushions and the wafer support slots, the first removable wafer cushion configured to support a third portion of the first quadrant periphery of the wafer; and a second removable wafer cushion attachable to the rear side of the front door adjacent a second side of the primary wafer cushion, the second removable wafer cushion defining a plurality of wafer-receiving grooves in alignment with the grooves of the primary wafer cushions and the wafer support slots, the second removable wafer cushion configured to support a third portion of the fourth quadrant periphery of the wafer.

In another embodiment, the claimed invention comprises a removable wafer cushion for attaching to a rear side of a door of a large-diameter wafer container and supporting wafers contained within the wafer container during shipment, the removable wafer cushion comprising: a first body portion defining a plurality of grooves configured to receive edge portions of the wafers and a plurality of wafer engagement portions formed within the grooves and configured to engage an edge of one of the plurality of wafers when the wafer enclosure is oriented in a vertical shipping position; a first plurality of attachment tabs distributed along a length of the first body portion and extending outwardly and away from the body portion, the attachment tabs defining distal ends configured to fit into apertures of the rear side of the door.

In another embodiment, the claimed invention comprises a wafer cushion kit, comprising: a wafer container enclosure configured to contain a plurality of semiconductor wafers, the wafer container defining a front opening and comprising a rear wall, and a plurality of wafer supports defining a plurality of slots for receiving edge portions of a plurality of wafers; a front door configured to attach to the wafer enclosure at the front opening and defining a front side and a rear side, the rear side presenting itself to an interior of the wafer enclosure; a first wafer cushion removably attachable to a rear side of the front door, the first wafer cushion defining a plurality of wafer grooves for receiving edge portions of the plurality of wafers, each of the grooves of the primary wafer cushion aligned with a slot of the wafer supports, the first wafer cushion configured to engage and support a plurality of wafers in a horizontal position; and a second wafer cushion removably attachable to a rear side of the front door, the first wafer cushion defining a plurality of wafer grooves for receiving edge portions of the plurality of wafers, each of the grooves of the primary wafer cushion aligned with a slot of the wafer supports, the second wafer cushion configured to engage and support the plurality of wafers in a vertical position; wherein the front door is configured to receive either the first wafer cushion or the second wafer cushion.

In another embodiment, the claimed invention comprises a method for converting a large-diameter, horizontal wafer container into a wafer shipper, the method comprising: removing a door of the wafer container from an enclosure of the wafer container; attaching a first removable wafer cushion to a first portion of the door of the wafer container adjacent a first side of a primary wafer cushion attached to the door, the primary wafer cushion located centrally on the door and configured to support a wafer during a fabrication process; and attaching a second removable wafer cushion to a second portion of the door of the wafer container adjacent a second side of the primary wafer cushion attached to the door.

In another embodiment, the claimed invention comprises a method for converting a large-diameter, horizontal wafer container into a wafer shipper, the method comprising: removing a door of the wafer container from an enclosure of the wafer container; removing a primary wafer cushion from the door of the wafer container; and attaching a removable wafer cushion to the door, thereby replacing the primary wafer cushion, the removable wafer cushion configured to engage a greater circumferential portion of each of a plurality of wafers to be contained in the wafer container.

BRIEF DESCRIPTION OF THE DRAWINGS

The embodiments of the present invention may be more completely understood in consideration of the following detailed description of various embodiments in connection with the accompanying drawings, in which:

FIG. 4 is an exploded isometric view of the front door assembly with removable shipping cushions of the wafer container of FIG. 1;

FIG. 5 is a top view of a door of a wafer container having a primary wafer cushion;

FIG. 6 is a top view of the door of FIG. 5 with added removable wafer cushions and a wafer enclosure containing a wafer, according to an embodiment of the invention;

FIG. 7 is top view of the door with cushions of FIG. 6 attached to the enclosure of FIG. 6;

FIG. 8 is a top view of a door of a wafer container having a primary wafer cushion;

FIG. 9 is a top view of the door of FIG. 8 with the primary wafer cushion replaced by an extended removable wafer cushion, according to an embodiment of the invention;

FIG. 10 is top view of the door with cushions of FIG. 9 attached to the enclosure of FIG. 9;

FIG. 11 is a top view of a door of a wafer container having a primary wafer cushion;

FIG. 12 is a top view of the door of FIG. 11 with added removable wafer cushions and a wafer enclosure containing a wafer, according to an embodiment of the invention;

FIG. 13 is top view of the door with cushions of FIG. 12 attached to the enclosure of FIG. 12, and a pair of left and right rear wafer cushions attached to the rear wall, according to an embodiment of the invention;

FIG. 14 is a top view of a door of a wafer container having a primary wafer cushion;

FIG. 15 is a top view of the door of FIG. 14 with the primary wafer cushion replaced by an extended removable wafer cushion, according to an embodiment of the invention;

FIG. 16 is top view of the door with cushions of FIG. 15 attached to the enclosure of FIG. 15, and a rear wafer cushion attached to the rear wall, according to an embodiment of the invention;

FIG. 17 is an illustration of a top view of a wafer divided into exemplary peripheral regions and contained and supported by a wafer carrier, according to an embodiment of the invention;

FIG. 18 depicts a wafer cushion kit, according to an embodiment of the invention;

FIGS. 19 and 20 depict graphical results of fragility testing conducted with a prior art wafer container without removable shipping cushions according to embodiments of the invention; and FIGS. 21 and 22 depict graphical results of fragility testing conducted with a wafer container with removable shipping cushions according to embodiments of the invention.

Figure 1:
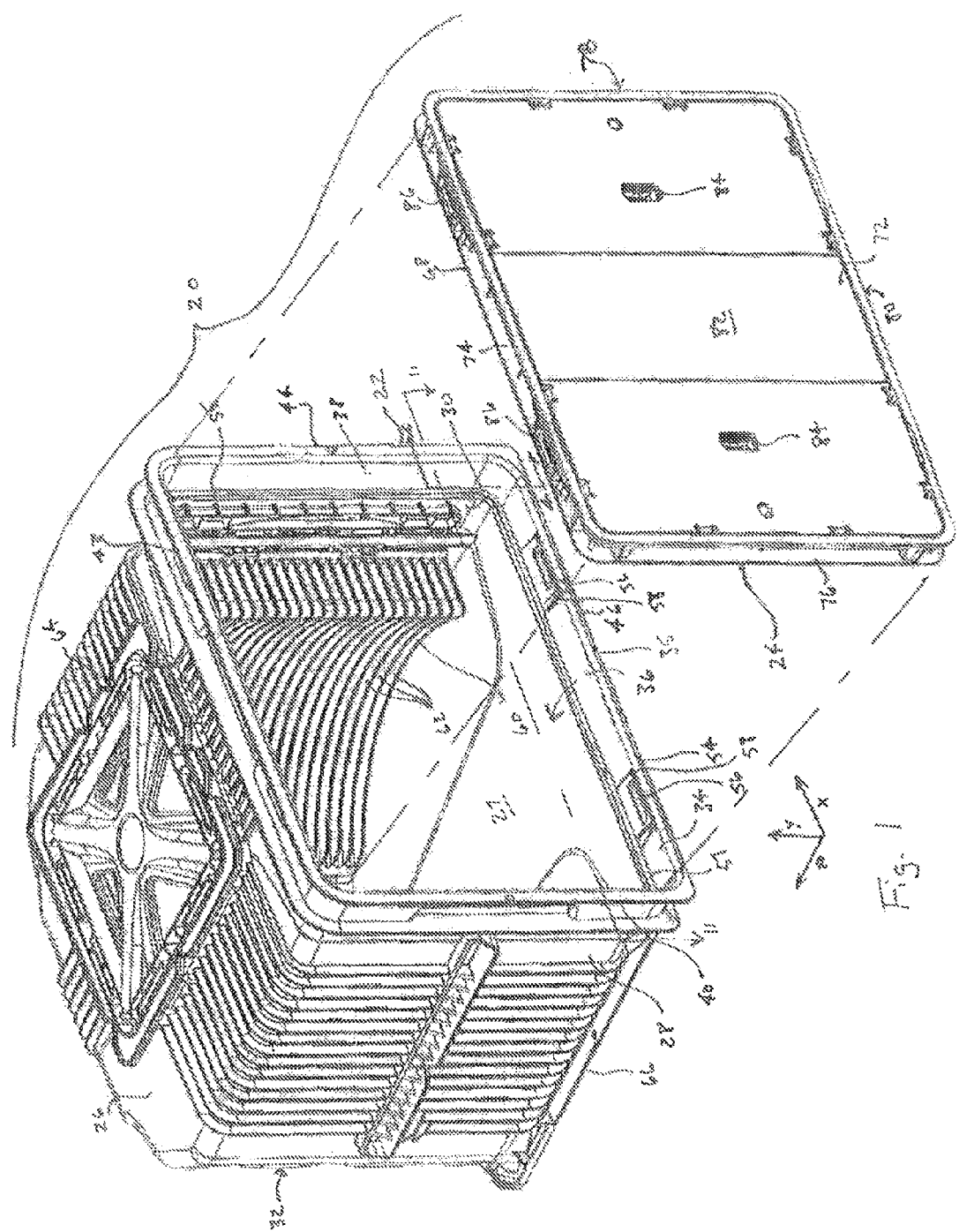
FIG. 1 is an exploded front isometric view of a front-opening wafer container with removable shipping cushions according to an embodiment of the invention.

While the present invention is amenable to various modifications and alternative forms, specifics thereof have been shown by way of example in the drawings and will be described in detail. It should be understood, however, that the intention is not to limit the present invention to the particular embodiments described. On the contrary, the intention is to cover all modifications, equivalents, and alternatives falling within the spirit and scope of the present invention.

DETAILED DESCRIPTION

For purposes of this application, relative direction may be described in terms of "x" and "y" and "z" directions, and these designations relative to the parts of the container are intended to be in accordance with the directional key provided as a part of FIG. 1. Relative orientation terms such as front, back/rear, side, top, bottom, and so on are also described below relative to embodiments of the claimed invention, and in particular, with respect to FIG. 1.

Referring to FIG. 1, a front opening wafer container 20 generally includes an enclosure portion 22 and a front door 24. Enclosure portion 22 generally includes top wall 26, bottom wall 27, side wall 28 (left side wall), side wall 30 (right side wall), rear or back wall 32, and door frame 34 defining a front opening 36. In addition, latch bolt recesses 56 are defined in each of top side 42 and bottom side 46 of door frame 34. Each latch bolt recess 56 is surrounded by raised portion 58. Outwardly facing interlock groove 55 is defined at inner edge 57 of door frame 34. Wafer support structure 60 may be provided inside enclosure portion 22 for receiving wafers in a plurality of slots 62. A robotic lifting flange 64 and a kinematic coupling 66 as are known in the art may be provided on the top and bottom outer surfaces respectively of enclosure portion 22.

Front door 24 generally includes body portion 68 presenting rear side 70, front side 72, top peripheral face 74, side peripheral faces 76, 78, and bottom peripheral face 80. A pair of latch recesses (not depicted) are defined in front side 72, and are covered by front panel 82. Each latch recess receives a latching mechanism (not depicted), operable by a key insertable though key apertures 84 in front panel 82 to selectively extend and retract latch bolts 86 to engage in latch bolt recesses 56 of container portion 22 to secure front door 24 in door frame 34. The latch mechanisms can be generally configured as disclosed in U.S. Pat. Nos. 4,995,430; 7,182,203; or 7,168,587, all of which are owned by the owner of the instant application, and all of which are hereby incorporated herein by reference.

For purposes of describing orientation of various structural components of wafer container 20, wafers, removable cushions of the claimed invention, and so on, terms such as "front", "rear", "top", 'bottom", "side" (including right side and left side), and so on will be used throughout the present specification. Such relative positional terms shall be understood to be consistent with the described walls and opening of wafer container 20, e.g., "front" indicates a direction toward or position near front opening 36.

Figure 2:
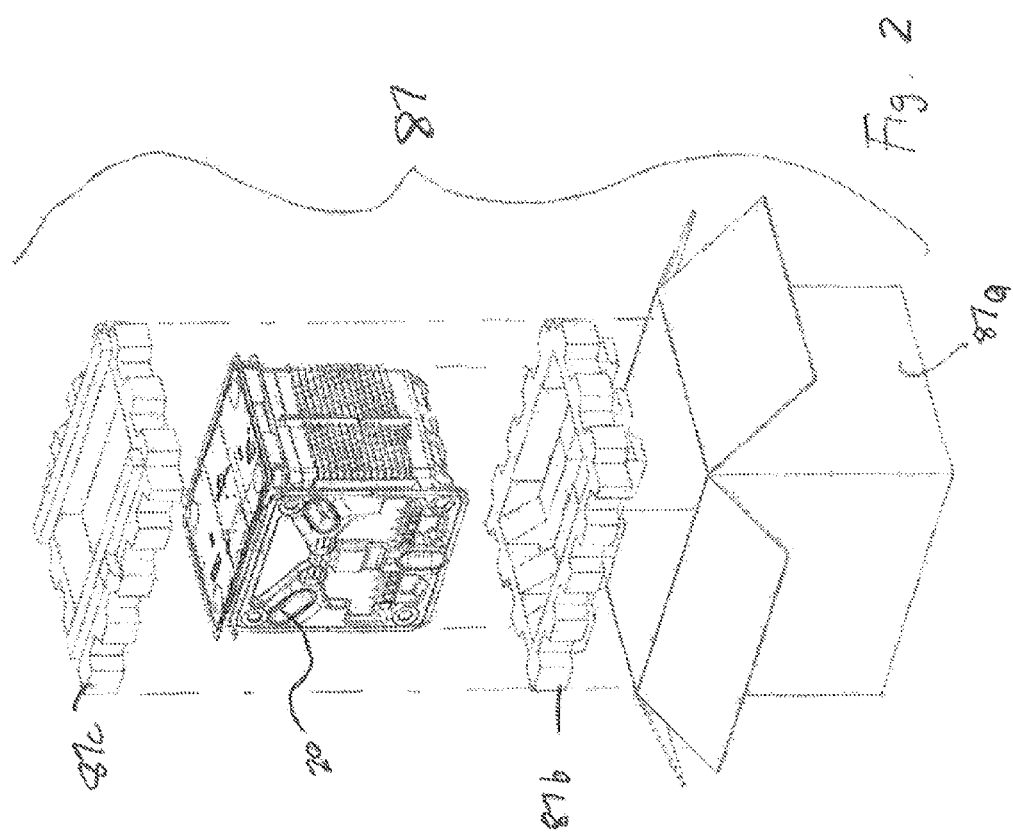
FIG. 2 is an exploded isometric view of a front-opening wafer container according to an embodiment of the invention with secondary packaging components.

As depicted in FIG. 2, wafer container 20 can be shipped individually in secondary packaging 87. Secondary packaging 87 may generally include carton 87a, and cushions 87b, 87c. As depicted, the front door 24 might be oriented upward when shipped as such, instead of laterally as designed, thereby altering the support geometry and stresses imposed on wafers contained within wafer container 20.

Figure 3:
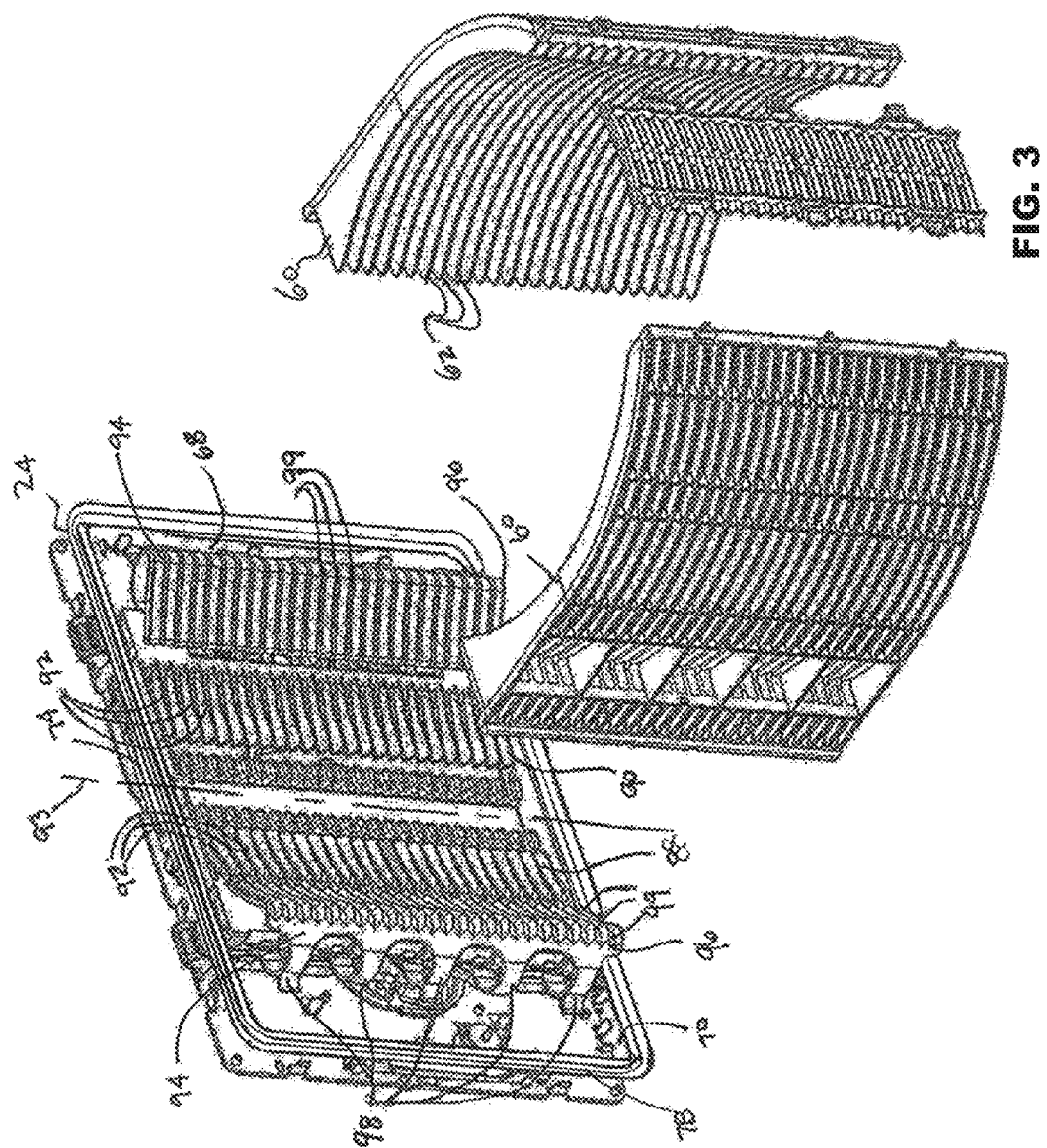
FIG. 3 is an isometric view of the front door and wafer support components of the wafer container of FIG. 1.

In FIGS. 3 and 4, there is depicted rear side 70 of front door 24. Primary wafer cushions 88, 90, are affixed to rear side 70 symmetrically about the central vertical axis 93 of front door 24. Each of primary wafer cushions 88, 90, defines a plurality of wafer-96 receiving grooves 92, each of which registers with a separate one of slots 62 such that the front edge of a wafer received and resting in one of slots 62 is received in one of grooves 92 when door 24 is received in door frame 34. Primary wafer cushions 88 and 90 may be separate structures, or may be integrated to form a single primary wafer cushion that includes cushions 88 and 90.

According to an embodiment of the invention, removable shipping cushions 94 are received on rear side 70 of front door 24 on each side and adjacent primary wafer cushions 88, 90, as depicted in FIGS. 3 and 4. Each of shipping cushion 94 generally includes body portion 96 with attachment tabs 98 extending therefrom. Each of body portions 96 extend vertically along the rear side of door 24, define wafer receiving grooves 99, and include wafer-engaging portions 101. Wafer-engaging portions 101 comprise those portions of body portion 96 that form the apex of the "V" shape of the wafer-receiving grooves and are in contact with a wafer when a wafer is placed into wafer container 20 in a vertical shipping orientation. Distal ends 100 of attachment tabs 98 are each received in a separate one of apertures 102 in vertical bulkhead 104 on rear side 70 of front door 24. Leading edge 106 of each shipping cushion 94 is received parallel and adjacent to lateral margins 108 of primary wafer cushions 88, 90 with wafer receiving grooves 99 registered and aligned with wafer receiving grooves 92 of primary wafer cushions 88, 90.

In use, with removable shipping cushion 94 installed on rear side 70 of front door 24, a plurality of wafers (not depicted) can be received in each of slots 62 and front door 24 can be secured in door frame 34 of enclosure portion 22. The front edge of each wafer is received and cushioned in one of wafer receiving grooves 92 of primary wafer cushions 88, 90, and is also received and cushioned in the wafer receiving grooves 99 of each of shipping cushion 94. As such, the wafers are supported at points not normally supported by the standard door 24 of wafer container 20. This allows for reduced cushioning requirements within the secondary packaging and full functionality with automation as defined in SEMI E159. The cushion may have a triangular or V-shaped foot print and be formed of a resiliently flexible polymer. As illustrated one leg 94.1 of the V is arcuate to follow the curvature of the wafers, and the other leg 94.2 may be curved to facilitate compressing the two legs to fix the cushion between slots 102 and the edge region 102.1 of the existing wafer cushion. The cushion may be retained in by being spring loaded. For example the tabs 98.1 and the associated legs 98.2 may be flexed toward each other, placed in a capture regions 98.3 on the door, and then released. The spring force will retain the cushion in place.

It will be appreciated that removable shipping cushion 94 can be installed and removed as desired. Thus, removable shipping cushion 94 can be installed at times when the container 20 with wafers contained therein will be shipped out of a facility to another facility, and thus will be potentially subject to increased physical shock loading. Conversely, removable shipping cushion 94 can be removed when the container is to be handled only within the facility and is not likely to be subject to increased shock loads or non-standard positioning, thereby preventing any potential interference by shipping cushion 94 with automated handling of container 20 within the facility, and increasing the versatility of container 20.

Referring to FIGS. 5-7, removable shipping cushion 94 attached to door 24 and to wafer container 20 are depicted in a top plan view.

Referring specifically to FIG. 5, a top view of front door 24 with wafer cushions 88 and 90 assembled to door 24 is depicted. Wafer cushions 88 and 90 are located on rear side 70 of front door 24, with wafer cushions 88 located off-center, or at a right side of door 24 and wafer cushions 90 also located off-center, or at a left side of door 24. In this view, right and left removable cushion 94 are not depicted. Door 24, having only primary cushions 88 and 90, represents a typical configuration for door 24 for use within a fabrication facility.

Referring to FIG. 6, modified door 24 having both primary cushions 88 and 90 and two sets of removable cushions 94, and its orientation prior to positioning on wafer container 20 is depicted. Cushions 94, comprising removable cushion 94a and removable cushion 94b are depicted in dashed lines to differentiate them from primary cushions 88 and 90. Right-side removable cushion 94a is attached to front door 24 adjacent right-side primary wafer cushion 88; left-side removable cushion 94b is attached to front door 24 adjacent left-side primary wafer cushion 90. Body portions 96 extend outward and away from door 24. Such a configuration may be used during transportation of wafers between facilities, during shipping, and so on.

Door 24 is oriented in front of wafer enclosure 22 for attachment to enclosure 22. A wafer 150 is depicted within enclosure 22.

Referring to FIG. 7, door 24 with both primary cushions 88, 90 and removable cushions 94a, 94b, is coupled to wafer enclosure 22. Primary cushions 88, 90 engage edges of wafer 150, just as they do when removable cushions 94a and 94b are not present. In addition, right-side removable cushion 94a engages an edge portion of wafer 150 on a right side, while left-side removable cushion 94b engages an edge portion of wafer 150 on a left side. As such, removable cushions 94a and 94b provide support to portions of wafer 150 that would otherwise not be supported by either primary cushions 88 and 90, or wafer support structure 60, thereby increasing the security of wafers 150 within wafer container 22.

Wafer supports 60 of enclosure 22 still support a large portion of wafer 150 on both a left and right side of the enclosure; primary wafer cushions support a portion of wafer 150 at the front; and front left and right removable portions add additional support to wafer 150 by supporting it in those regions between the wafer supports 60 and the primary wafer cushion 88, 90 that were previously unsupported.

In an alternate embodiment, rather than supplementing existing primary wafer cushions 88 and 90 with removable cushions 94, embodiments of the claimed invention includes a single, integrated removable wafer cushion 160 that provides cushioning equivalent to primary wafer cushions 88 and 90 in combination with above described removable cushions 94.

Referring to FIGS. 8-10, an embodiment of removable wafer cushion 160 is described and depicted.

Referring to FIG. 8, standard front door 24 having primary cushions 88, 90 is depicted. As depicted, cushions 88 and 90 may comprise a single, integrated cushion set, removable as a single unit.

Referring to FIG. 9, modified front door 24 and wafer enclosure 22 are depicted. Modified front door 24 no longer includes primary cushions 88 and 90. Primary cushions 88 and 90 have been removed and replaced with extended removable cushion 160.

Extended removable cushion 160 is received by front door 24 at its rear surface 70. Extended removable cushion 160 is configured to attach to door 24 in the same manner, and using the same structure, that primary cushions 88 and 90 used. In an embodiment, cushion 160 includes projections and recesses that couple with recesses and projections of door 24.

Extended removable cushion 160 includes right-side portion 162, left-side portion 164, and central portion 166. Right-side portion 162 is substantially the same as removable cushion 94a as described above; left-side portion 164 is substantially the same as removable cushion 94b as described above, and central portion 166 is substantially the same as primary cushions 88 and 90.

As such, extended removable cushion 160 extends from central axis 93 (see also FIGS. 3 and 4) leftwardly and rightwardly to provide contiguous wafer support about a significant portion of wafer 150, as depicted in FIG. 10.

Extended removable cushion 160 provides some improvements over its separate counterparts. As an integrated structure, no gaps are introduced between cushions, such as where leading edges 106 of removable cushions 94 meet lateral margins 108 of primary wafer cushions 88 and 90. Not only does the integrated structure of extended cushion 160 avoid such gaps, but the removal of such gaps avoids any issues associated with aligning grooves between cushions.

During shipment, extended cushion 160 provides support to wafers 150. When arriving at a destination, such as a fabrication facility, door 24 may be removed, extended removable cushion 160 may be removed from door 24, and primary cushion 88, 90 may be installed for the remainder of the fabrication process. Extended removable cushion 160 may replace primary cushions 88 and 90 as needed to repeat the process, and to facilitate shipping of further wafers 150.

In another embodiment, embodiments of the cushion system of the present invention may also include a removable rear cushion, such as removable rear cushion, in addition to front cushions, as depicted in FIGS. 11-16. The addition of rear removable wafer cushions makes it possible to support a wafer 150 about nearly its entire circumference.

Referring to FIGS. 11-13, an embodiment of a cushion system including both front and rear cushions, including a central rear cushion spacer 170 is depicted.

Referring specifically to FIGS. 11 and 12, primary cushions 88 and 90 are supplemented by front left and right removable spacer cushions 94a and 94b, as described above with respect to FIGS. 5-7.

Referring to FIG. 13, left and right rear wafer cushions 170b and 170 are attached to rear wall 32. The addition of removable rear wafer cushions 170a and 170a increases the support of wafer 150 at a rear of enclosure 122, supporting portions of wafer 150 that were previously unsupported. In this embodiment, nearly all of the circumference of wafer 150 is supported with the addition of both front and rear wafer cushions.

Referring to FIGS. 14-16, an alternate embodiment of a cushion system having a rear wafer cushion 170 is depicted.

This embodiment of the cushion system is substantially the same as the one depicted in FIGS. 11-13, with the exception of differences in the front and rear cushioning systems. In the embodiment of FIGS. 14-16, front cushioning is accomplished by unitary cushion 160, as described above, while rear cushion 170 comprises a one-piece cushion located a center portion of rear wall 32. Similar to the embodiment depicted in FIGS. 11-13, the embodiment of FIGS. 14-16 maximizes the amount of support provided by the cushion system to wafer 150.

Referring to FIG. 17, wafer 150 in a wafer container 22 is depicted in a top view. FIG. 17 divides a periphery, or circumference, of wafer 150 into four quadrants and multiple regions to depict and describe which portions of wafer 150 are supported by the various structures. As wafer 150 is circular in shape, it can be divided into 360 degrees, with 0 degrees being at point a on the periphery of wafer 150. For orientation purposes, a central vertical axis, axis Y is depicted, as is a central horizontal axis, axis X. The multiple regions A through H also have corresponding angles A1 to H to aid in describing how wafer 150 is supported about its periphery.

A first wafer quadrant is defined from 0 degrees to 90 degrees, and includes regions A, B, and C1. A second wafer quadrant is defined from 90 degrees to 180 degrees and includes regions C2, D, and E1. A third wafer quadrant is defined from 180 degrees to 270 degrees, and includes regions E2, F, and G1. A fourth wafer quadrant is defined from 270 degrees to 360 degrees, and includes regions G2, H, and A1.

In a typical wafer container that does not include the removable wafer cushion system of the claimed invention, region A is supported by front primary cushions 90, region C is supported by left-side wafer supports 60, and region G is supported by right-side wafer supports 60. Regions B, D, E, F, and H are generally unsupported.

On the contrary, wafer container 22 that includes the various embodiments of front and rear removable wafer cushions can support a wafer 150 in regions B, D, E, F, and H, that were previously unsupported.

Region B may be supported by left-front removable wafer cushion 94b; regions D, E, and F may be supported by rear wafer cushions 170b and 170a (or alternatively, region E is supported by rear wafer cushion 170); and region H may be supported by right-front removable wafer cushion 94a. In am embodiment, a majority of each of regions B, D, E, F, and H are supported by their respective removable wafer cushions. In another embodiment, substantially all of each of regions B, D, E, F, and H are supported by their respective removable wafer cushions. In other embodiments, some portions of some regions B, D, E, F, and H are supported by removable wafer cushions, depending on the desired level of support required for shipping and transport purposes.

As depicted, region A1 corresponds to a periphery of wafer 150 ranging from 0 degrees to approximately 25 degrees, such that angle A2 is approximately 25 degrees. The periphery of wafer 150 in region A1 is typically supported by primary wafer cushion 90. In some embodiments, region A1 ranges from 0 degrees to approximately 30 or 35 degrees.

Peripheral region B corresponds to a periphery of wafer 150 ranging from approximately 25 degrees to approximately 45 degrees, such that angle B1 is approximately 20 degrees. In a wafer container not having a removable front wafer cushion 94b, this region of wafer 150 will generally be unsupported. Region B may be supported by wafer cushion 94b or wafer cushion 160.

Peripheral region C corresponds to a periphery of wafer 150 ranging from approximately 45 degrees to approximately 135 degrees, such that each of angles C1 and C2 are approximately 45 degrees. This region is generally supported by wafer supports 60.

Peripheral region D corresponds to a periphery of wafer 150 ranging from approximately 135 degrees to approximately 150 degrees, such that angle D1 is approximately 20 degrees. In a wafer container not having a removable front wafer cushion 170b, this region of wafer 150 will generally be unsupported. Region B may be supported by wafer cushion 170b or in part by a wafer cushion 170.

Peripheral region E corresponds to a periphery of wafer 150 ranging from approximately 155 degrees to approximately 205 degrees, such that each of angle E1 and E2 is approximately 25 degrees. In a wafer container not having a removable front wafer cushion 170 or 170b, this region of wafer 150 will generally be unsupported. Region E may be supported by all or portions of wafer cushion 170, 170a or 170b.

Peripheral region F corresponds to a periphery of wafer 150 ranging from approximately 205 degrees to approximately 225 degrees, such that angle F1 is approximately 20 degrees. In a wafer container not having a removable front wafer cushion 170a, or 170, this region of wafer 150 will generally be unsupported. Region F may be supported by wafer cushion 170b or in part by a wafer cushion 170.

Peripheral region G corresponds to a periphery of wafer 150 ranging from approximately 225 degrees to approximately 315 degrees, such that each of angles G1 and G2 are approximately 45 degrees. This region is generally supported by wafer supports 60.

Peripheral region H corresponds to a periphery of wafer 150 ranging from approximately 315 degrees to approximately 335 degrees, such that angle H1 is approximately 20 degrees. In a wafer container not having a removable front wafer cushion 94a or 160, this region of wafer 150 will generally be unsupported. Region H may be supported by wafer cushion 94a or 160.

Peripheral region A2 corresponds to a periphery of wafer 150 ranging from approximately 335 degrees to approximately 360 degrees, such that angle A1 is approximately 25 degrees. This region is typically supported by primary cushion 88.

Although approximate angles and regions are described above with respect to FIG. 17, it will be understood that embodiments of the claimed invention, are provided for exemplary purposes, and that the angles and regions described may vary.

Referring to FIG. 18, embodiments of a cushion kit 180 are depicted. Cushion kit 180 in an embodiment may include front cushioning and/or rear cushioning. As such, cushion kit 180 may include a front cushioning system comprising primary cushions 88 and 90 along with right removable cushion 94a and left removable cushion 94b. In another embodiment, cushion kit 180 may include a front cushioning system comprising of extended removable cushion 160. In either embodiment, cushion kit 180 may also include rear cushion 170.

As described above, rear cushion 170 may be attached to rear wall 32 inside wafer enclosure 22 in a manner similar to the manner that primary cushions 88 and 90 attached to door 24, or in another manner as will be understood by those of ordinary skill, including via a snap fit or fasteners.

Any combination of front and rear cushioning may be used to support and cushion wafers 150 within wafer container 22 for safe and reliable shipping.

In addition to the systems and devices described above, embodiments of the claimed invention also include various methods relating to cushioning of wafers within a wafer container. Some of those methods are described above, and some below, including a method for converting a large-diameter, horizontal wafer container into a wafer shipper.

In one such embodiment, door 24 of large diameter wafer container 22 is removed from enclosure 20. Removable wafer cushion 94b is aligned with door 24. Left or partial removable cushion 94b is attached to door 24, off center, at a left side of door 24, adjacent primary cushion 90. Right or partial removable cushion 94a is attached to door 24, off center, at a right side adjacent primary cushion 90. Leading edges 106 of left and right removable cushions 94a and 94b are received parallel and adjacent to lateral margins 108 of primary wafer cushions 88, 90 with wafer receiving grooves 99 registered and aligned with wafer receiving grooves 92 of primary wafer cushions 88, 90.

In another embodiment, the above-described method further includes attaching removable rear cushion 180 to rear wall 32 of wafer enclosure 32.

In yet another embodiment, rather than attaching left and right partial removable cushions, the method includes removing centrally-located, primary cushions 88 and 90 from door 90, and attaching an extended or full removable cushion 170 that extends leftwardly and rightwardly from a central vertical axis of door 24. Extended, removable cushion 170 may comprise a single cushion or cushion assembly.

Embodiments of the systems, devices, and methods of the claimed invention reduce breakage or damage to wafers during shipment and handling. As described below in FIGS. 12-15, such improvements can be significant.

"Fragility" is defined as the maximum acceleration at critical velocity that a wafer can withstand before breakage occurs as measured with destructive testing. As depicted in FIGS. 19 and 20, physical shock testing conducted using prior art wafer containers without removable shipping cushion 94 shows a fragility value of wafers on a horizontal impact just before and after wafer breakage of somewhere between 8.31 G and 16.26 G based on the Standard designed wafer support & retainer system. Locations for wafer support were driven by SEMI Standard E159.

As depicted in FIGS. 21 and 22, physical shock testing was conducted under similar or even more severe physical shock conditions as in the tests reflected in FIGS. 21 and 22 (container dropped from 32 inch height with a borofloat glass test wafer), with removable shipping cushion 94 installed in the container. Wafer fragility values with removable shipping cushion 94 increase the G values to between 21.74 G and 25.87 G before failure or breakage occurs, thus providing a significant advantage over the prior art containers, especially when wafer container 20 is shipped individually packaged as depicted in FIG. 2.

The foregoing descriptions present numerous specific details that provide a thorough understanding of various embodiments of the invention. It will be apparent to one skilled in the art that various embodiments, having been disclosed herein, may be practiced without some or all of these specific details. In other instances, components as are known to those of ordinary skill in the art have not been described in detail herein in order to avoid unnecessarily obscuring the present invention. It is to be understood that even though numerous characteristics and advantages of various embodiments are set forth in the foregoing description, together with details of the structure and function of various embodiments, this disclosure is illustrative only. Other embodiments may be constructed that nevertheless employ the principles and spirit of the present invention. Accordingly, this application is intended to cover any adaptations or variations of the invention.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A cushioned wafer container system having removable wafer cushions for transporting large-diameter wafers, the system comprising:

a wafer container enclosure configured to contain a plurality of semiconductor wafers, each wafer including a wafer periphery defining a first, second, third, and fourth quadrant, the wafer container defining a front opening and comprising a rear wall, and a plurality of wafer supports defining a plurality of slots for receiving edge portions of a plurality of wafers, the wafer supports supporting a first portion of a first quadrant periphery of the wafer and a first portion of a fourth quadrant periphery of the wafer;

a front door configured to attach to the wafer enclosure at the front opening and defining a front side and a rear side, the rear side presenting itself to an interior of the wafer enclosure;

a primary wafer cushion coupled to the rear side of the front door at a central portion of the front door, the primary wafer cushion defining a plurality of wafer grooves configured to receive and support a second portion of the first quadrant periphery of the wafer and a second portion of the fourth quadrant periphery of the wafer, each of the grooves of the primary wafer cushion aligned with a slot of the wafer supports;

a first removable wafer cushion separate from the primary wafer cushion and attachable to the rear side of the front door adjacent a first side of the primary wafer cushion, the first removable wafer cushion defining a plurality of wafer-receiving grooves in alignment with the grooves of the primary wafer cushions and the wafer support slots, the first removable wafer cushion configured to support a third portion of the first quadrant periphery of the wafer; and wafer support slots, the second removable wafer cushion configured to support a third portion of the fourth quadrant periphery of the wafer, wherein the first quadrant periphery includes a fourth, unsupported portion, the fourth unsupported portion having a peripheral length less than a peripheral length of the third portion supported by the first removable wafer cushion.

2. The system of claim 1, wherein the first removable wafer cushion includes a plurality of wafer engagement portions formed at an apex of the grooves and configured to engage an edge of one of the plurality of wafers when the wafer enclosure is oriented in a vertical shipping position.

3. The system of claim 1, wherein the first removable wafer cushion includes a plurality of attachment tabs attaching the first wafer cushion to the rear side of the door.

4. The system of claim 3, wherein the plurality of attachment tabs are received by a plurality of apertures in a vertical bulkhead of the door.

5. The system of claim 1, wherein the first removable wafer cushion presents a leading each edge that is parallel and adjacent to lateral margins of the primary wafer cushion.

6. The system of claim 1, further comprising a rear removable wafer cushion attached to the rear wall of the wafer enclosure and configured to engage and support portions of the wafers.

7. The system of claim 1, wherein the first removable wafer cushion is removably attached to the rear side of the door.

8. The system of claim 1, wherein the first and second removable cushions are configured to support a majority those peripheral portions of the wafer not supported by the primary cushion or the wafer supports, in the first and fourth quadrants of the wafer.

9. A cushioned wafer container system, comprising
   a wafer container enclosure configured to contain a plurality of semiconductor wafers, the wafer container defining a front opening and comprising a rear wall, and a plurality of wafer supports defining a plurality of slots for receiving edge portions of a plurality of wafers;
   a front door configured to attach to the wafer enclosure at the front opening and defining a front side and a rear side, the rear side presenting itself to an interior of the wafer enclosure;
   a first wafer cushion removably attachable to a rear side of the front door, the first wafer cushion defining a plurality of wafer grooves for receiving edge portions of the plurality of wafers, each of the grooves of the first wafer cushion aligned with a slot of the wafer supports, the first wafer cushion configured to engage and support a plurality of wafers in a horizontal position; and
   a second wafer cushion separate from the first wafer cushion and removably attachable to a rear side of the front door, the first wafer cushion defining a plurality of wafer grooves for receiving edge portions of the plurality of wafers, each of the grooves of the second wafer cushion aligned with a slot of the wafer supports, the second wafer cushion configured to engage and support the plurality of wafers in a vertical position, the second wafer cushion being selectively attachable to the rear side of the front door separately from the first wafer cushion;
   wherein the front door is configured to receive either the first wafer cushion or the second wafer cushion.

10. The cushioned wafer container system of claim 9, wherein the first wafer cushion comprises a primary wafer cushion attached to the door during a fabrication process.

11. The cushioned wafer container system of claim 9, wherein the second wafer cushion is attached to the door during shipment.

12. The cushioned wafer container system of claim 9, wherein the first wafer cushion includes a first plurality of engagement portions for engaging edge portions of the plurality of wafers, and the second wafer cushion includes a second plurality of engagement portions for engaging edge portions of the plurality of wafers.

13. The cushioned wafer container system of claim 12, wherein each of the plurality of second engagement portions of the second wafer cushion engages a greater circumferential portion of each of the plurality of wafers as compared to the circumferential portion of each of the plurality of wafers as engaged by the first engagement portions of the first wafer cushion.

14. The cushioned wafer container system of claim 9, wherein the second wafer cushion extends laterally, away from a center of the door, a distance that is greater than a lateral distance extended by the first wafer cushion.

15. A cushioned wafer container system having removable wafer cushions for transporting large-diameter wafers, the system comprising:
   a wafer container enclosure configured to contain a plurality of semiconductor wafers, each wafer including a wafer periphery defining a first, second, third, and fourth quadrant, the wafer container defining a front opening and comprising a rear wall, and a plurality of wafer supports defining a plurality of slots for receiving edge portions of a plurality of wafers, the wafer supports supporting a first portion of a first quadrant periphery of the wafer and a first portion of a fourth quadrant periphery of the wafer;
   a front door configured to attach to the wafer enclosure at the front opening and defining a front side and a rear side, the rear side presenting itself to an interior of the wafer enclosure;
   a primary wafer cushion coupled to a rear side of the front door at a central portion of the front door, the primary wafer cushion defining a plurality of wafer grooves configured to receive and support a second portion of the first quadrant periphery of the wafer and a second portion of the fourth quadrant periphery of the wafer, each of the grooves of the primary wafer cushion aligned with a slot of the wafer supports;
   a first removable wafer cushion separate from the primary wafer cushion and engageable with the rear side of the front door adjacent a first side of the primary wafer cushion, the first removable wafer cushion configured to support a third portion of the first quadrant periphery of the wafer, the first removable wafer cushion being selectively engageable to the rear side of the front door separately from the primary wafer cushion; and
   a second removable wafer cushion separate from the primary wafer cushion and engageable with the rear side of the front door adjacent a second side of the primary wafer cushion, the second removable wafer cushion configured to support a third portion of the fourth quadrant periphery of the wafer, the second removable wafer cushion being selectively engageable to the rear side of the front door separately from the primary wafer cushion and the first removable wafer cushion.

16. The system of claim 15, wherein the first removable wafer cushion and the second removable wafer cushion each include a plurality of wafer engagement portions each configured to engage a discrete edge of one of the plurality of wafers when the wafer enclosure is oriented in a vertical shipping position.

17. The system of claim 15, wherein the first removable wafer cushion and the second removable wafer cushion each include a plurality of attachment tabs attaching the respective wafer cushion to the rear side of the door.

18. The system of claim 15, wherein first and second removable wafer cushions are each retained to the door by spring loading.

* * * * *